US008796139B2

(12) United States Patent
Ramasamy et al.

(10) Patent No.: US 8,796,139 B2
(45) Date of Patent: Aug. 5, 2014

(54) EMBEDDED WAFER LEVEL BALL GRID ARRAY BAR SYSTEMS AND METHODS

(71) Applicant: STMicroelectronics Pte Ltd., Singapore (SG)

(72) Inventors: Anandan Ramasamy, Singapore (SG); Yonggang Jin, Singapore (SG); Yun Liu, Singapore (SG)

(73) Assignee: STMicroelectronics Pte Ltd, Singapore (SG)

( * ) Notice: Subject to any disclaimer, the term of this patent is extended or adjusted under 35 U.S.C. 154(b) by 0 days.

(21) Appl. No.: 13/722,776

(22) Filed: Dec. 20, 2012

(65) Prior Publication Data

US 2013/0168858 A1  Jul. 4, 2013

Related U.S. Application Data

(60) Provisional application No. 61/460,777, filed on Dec. 29, 2011.

(51) Int. Cl.
*H01L 21/44* (2006.01)

(52) U.S. Cl.
USPC ........... 438/667; 438/107; 438/126; 257/698; 257/774; 257/E23.011; 257/E23.019

(58) Field of Classification Search
USPC .................. 438/667, 107, 126; 257/698, 774, 257/E23.011, E23.019
See application file for complete search history.

(56) References Cited

U.S. PATENT DOCUMENTS

| 2009/0146297 | A1* | 6/2009 | Badakere et al. | 257/737 |
| 2011/0068468 | A1* | 3/2011 | Lin et al. | 257/737 |
| 2012/0299191 | A1* | 11/2012 | Camacho | 257/774 |
| 2013/0069222 | A1* | 3/2013 | Camacho | 257/737 |

* cited by examiner

*Primary Examiner* — Tu-Tu Ho
(74) *Attorney, Agent, or Firm* — Seed IP Law Group PLLC

(57) ABSTRACT

A bar formed from a reconstituted wafer and containing one or more conductive material filled voids is used to electrically and physically connect the top and bottom packages in a package-on-package (PoP) package. The bar is disposed in the fan out area of the lower package forming the PoP package.

18 Claims, 14 Drawing Sheets

EMBEDDED WAFER LEVEL BALL GRID ARRAY BAR SYSTEMS AND METHODS

BACKGROUND

1. Technical Field

This disclosure generally relates to packaging of integrated circuits and particularly relates to conductive bar systems useful in the production of package-on-package (PoP) semiconductor packages.

2. Description of the Related Art

Ongoing demand for smaller electronic devices has pressured manufacturers of such devices to increase the component density and reduce the component size wherever possible within the device. Integrated circuit manufacturers have responded by increasing the use of chip scale packaging and wafer level packaging techniques to minimize the footprint of the integrated circuit package, at times reducing the package to a size approaching the size of the semiconductor die itself through the use of direct surface mountable ball grid arrays and flip chip configurations.

The drive to reduce size is not without consequences, however. The reduced package size may render the distribution of solder balls on the semiconductor die itself physically impossible—for example where the resultant contact pad pitch would be less than the diameter of the solder balls used to in the ball grid array. One solution to accommodating ball grid arrays requiring a large number of contacts is through the use of a material or compound disposed about the periphery of the semiconductor die. The additional surface area thus provided permits the formation of a redistribution layer having an acceptable contact pad spacing or pitch. Such semiconductor packages are referred to as "fan out" wafer level packages or embedded wafer level ball grid array (eWLB) packages.

To further consolidate and conserve circuit board real estate semiconductor packages may also be vertically stacked to form a Package-on-Package (PoP) package. A PoP package is formed by stacking a top package (the "PoPt package") on a bottom package (the "PoPb package"). In some PoP packages, electrical connections between the PoPt and PoPb packages are made between one or more contact pads on the lower surface of the PoPt package and one or more contact pads on the upper surface of the PoPb package fan out area, for example through the use of appropriate diameter solder balls disposed between the PoPt and PoPb semiconductor packages.

Physically, the PoPb package has a stepped appearance, with the fan out area at a lower height than the central area mold cap covering the semiconductor die. The height of the step in the PoPb package varies, but is generally on the order of a few tenths of a millimeter. The step height controls the minimum distance achievable between the PoPt and PoPb packages. Larger diameter solder balls are used to span the increased distance between the PoPt package and the fan out area of the PoPb package however, the use of larger solder balls to attach the PoPt package to the PoPb package effectively decreases the solder ball density (or, alternatively, limits the ball pitch) achievable on the PoPt package ball grid array. For example, where a 0.3 mm solder ball on a 0.5 mm pitch may be achievable between the PoPb package and the underlying substrate, the step height distance between the PoPb package and the PoPt package may require the use of a 0.5 mm solder ball on a pitch ranging from 0.6 mm to 0.85 mm.

Additional considerations in PoP packaging include the effects of thermal expansion, in particular, the differential thermal expansion between PoPt and PoPb packages and between the PoP package and the underlying substrate to which it is attached. Thermal cycling the PoP package can cause fatigue or stress cracks to form in the solder connections linking the various packages forming the PoP or between the PoP package and the circuit board to which the package is attached. The use of larger solder balls to span the distance between PoPt and PoPb packages exacerbates the issues by increasing the forces exerted on the solder connections. It is desirable, therefore, to provide a cost-effective and flexible solution for electrically coupling the semiconductor packages within a PoP package.

BRIEF SUMMARY

According to principles as explained herein, stacked top and bottom semiconductor packages forming a PoP package are physically and electrically coupled using a conductive material surrounded by a reconstituted wafer. The reconstituted wafer is first formed about a plurality of dies then a number of voids are formed within the reconstituted wafer. The voids are filled with a conductive material to form a bar having at least one, but often more, individual conductive material filled voids surrounded by the reconstituted wafer. The number of conductors within the bar can be easily adjusted by forming and filling a greater or lesser number of voids within the reconstituted wafer. Similarly, the pattern formed by the conductive material filled voids or conductors in the bar can be easily changed or varied to accommodate the stacking of semiconductor packages having different sizes, shapes, physical configurations, conductor counts, contact pad arrangements, etc. within the PoP package. Additionally, one or more physical dimensions of the bar, such as the height of the bar, may be easily varied by adjusting the thickness or finishing of the reconstituted wafer surrounding the conductive material filled voids or conductors to accommodate the gap between the PoPt and PoPb packages forming the PoP package.

A bar containing at least one conductive material filled void formed within a section of reconstituted wafer is grouped with at least one semiconductor die to provide at least one semiconductor package useful in constructing a PoP package. In some instances, the reconstituted wafer surrounding the at least one conductive material filled void is used to group the semiconductor die with the bar or bars. In other instances, the bar is a physically discrete structure containing the conductive material filled voids surrounded by the reconstituted wafer grouped with a semiconductor die using mold compound or a similar material.

Regardless of the method used to provide the semiconductor package, the conductive material filled voids providing the conductors linking the PoPt and PoPb packages are formed within and surrounded by the reconstituted wafer. Redistribution layers may be added to the top, bottom, or both the top and bottom of the resultant semiconductor package to both seal the reconstituted wafer surrounding the conductive material filled voids and to electrically couple the PoPt package, PoPb package and underlying substrate.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc.

Unless the context requires otherwise, throughout the specification and claims which follow, the word "comprise" and variations thereof, such as "comprises" and "comprising" are to be construed in an open, inclusive sense, that is, as "including, but not limited to."

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

Figure 1A:
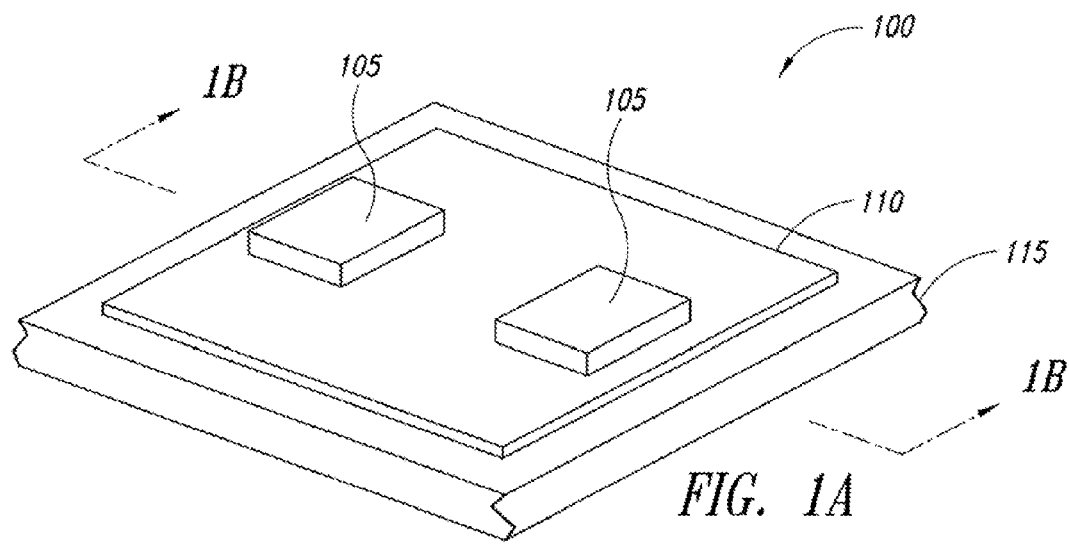
FIGS. 1A, 1B and 1C provide perspective and sectional views depicting example tape disposed on a metal substrate with and without dies attached.
Figure 1B:
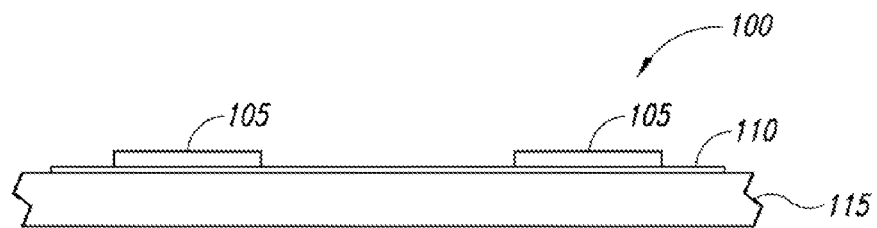

FIGS. 1A and 1B show two dies 105 attached to generally planar carrier including an adhesive tape or film 110 disposed on a rigid substrate 115. As is known in the manufacture of semiconductor packages, a plurality, sometimes tens or even hundreds of dies 105 may be positioned on the carrier in preparation for forming a reconstituted wafer. For clarity and ease of discussion, only two dies 105 are depicted and described herein, however the methods and systems described herein are broadly applicable to include any number of dies 105.

In preparation for forming the reconstituted wafer, the dies 105 are attached to an adhesive film or tape 110 disposed on a rigid substrate 115. In some instances the rigid substrate 115 is a generally planar metallic member providing physical strength and support for the reconstituted wafer and also provides a generally planar surface upon which the reconstituted wafer is formed. In some instances, the dies 105 and the carrier may be annealed to improve one or more physical or performance characteristics, for example adhesion of the dies 105 to the adhesive film or tape 110.

Figure 4A:
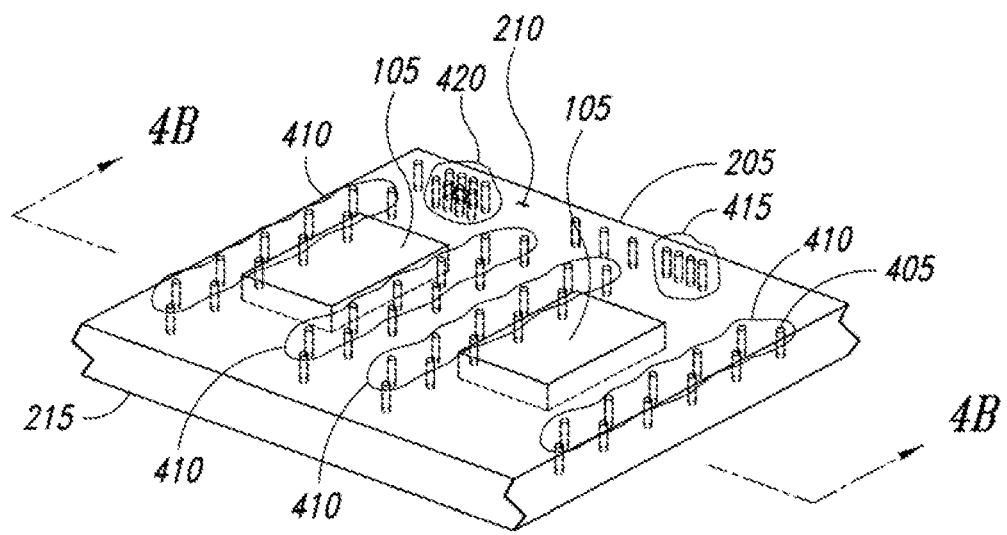
FIGS. 4A and 4B are perspective and sectional views, respectively, depicting an example plurality of voids formed within the reconstituted wafer.
Figure 4B:
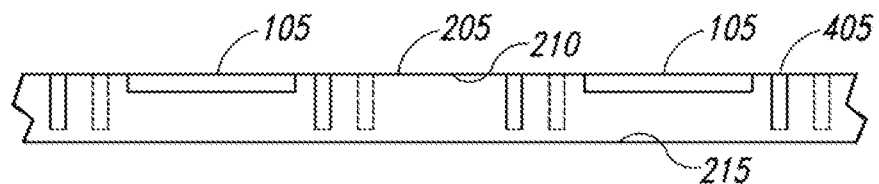

In some instances, the dies 105 are inert, blank, reference or similar dies useful in maintaining proper spacing or geometry of the voids formed within the reconstituted wafer (ref. FIGS. 4A and 4B). In other instances the dies 105 are semiconductor dies. In yet other instances, a portion of the dies 105 are inert reference dies and the remaining portion of the dies 105 are semiconductor dies. Although depicted as being of equal size in FIGS. 1A and 1B, the dies 105 can have any physical size, shape, thickness and/or configuration and need not be of equal size and shape. Once placed on the carrier, the dies 105 are prepared for the formation of a reconstituted wafer about the dies 105.

Figure 1C:
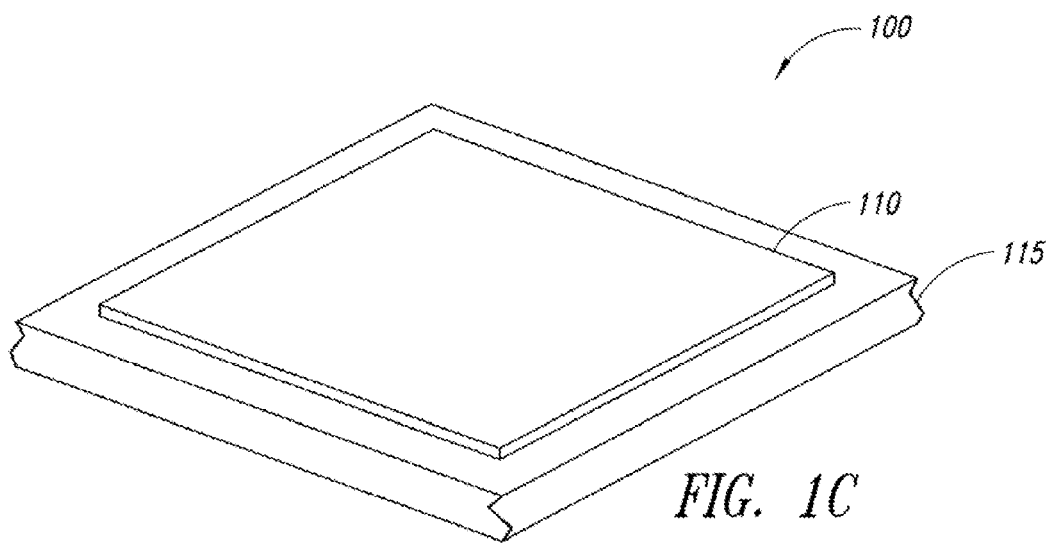

Alternatively, FIG. 1C depicts the instance where no dies 105 are disposed proximate the adhesive film or tape 110 prior to the formation of the reconstituted wafer. When no dies 105 are used, proper spacing between the voids formed within the reconstituted wafer may be maintained for example through the use of computer aided design and manufacturing techniques.

Figure 2A:
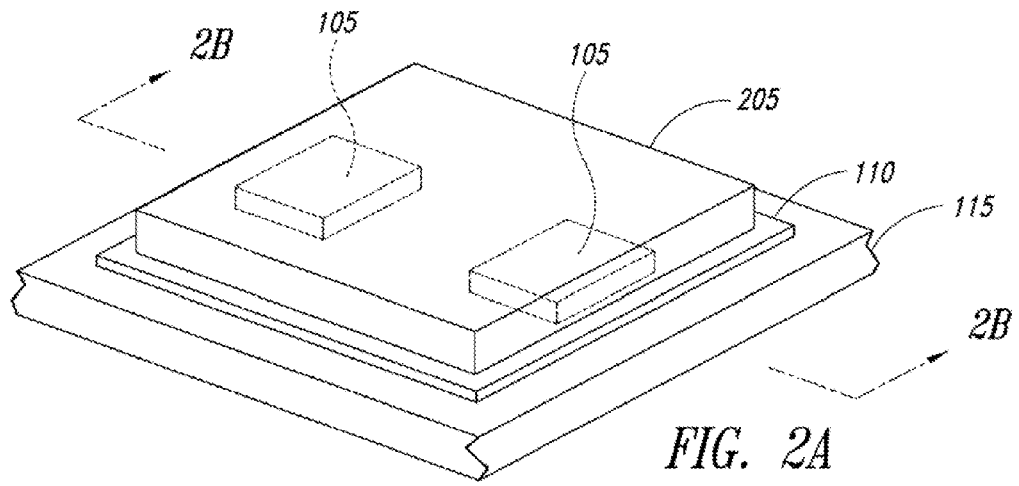
FIGS. 2A, 2B and 2C provide perspective and sectional views depicting an example reconstituted wafer formed on tape disposed on a metal substrate with and without dies attached.
Figure 2B:
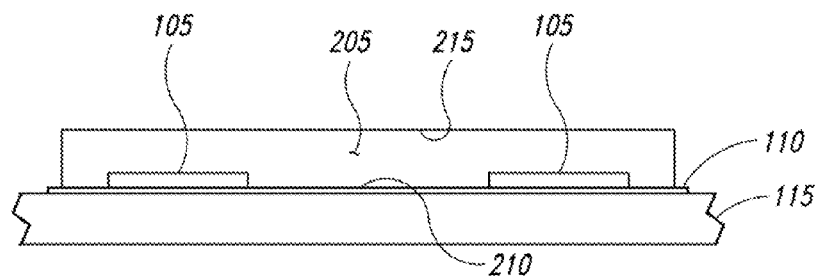
Figure 2C:
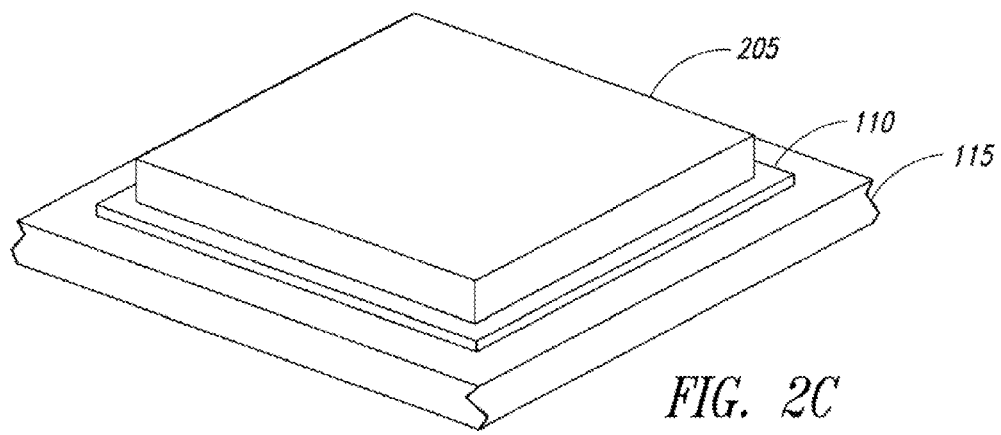

FIGS. 2A and 2B show the formation of a reconstituted wafer 205 about the dies 105. The reconstituted wafer 205 is provided by partially or completely surrounding, blanketing or covering the dies 105 with a mold compound. FIG. 2C depicts an alternate embodiment where no dies 105 are disposed proximate the adhesive film or tape 110 prior to the formation of the reconstituted wafer 205. The mold compound used for forming the reconstituted wafer 205 is a non-homogenous thermosetting or thermoplastic compound. In one example, the mold compound used to form the reconstituted wafer 205 can contain about 10%-45% (w/w) epoxy matrix; about 50%-85% (w/w) silica filler; and about 5%-15% (w/w) additives such as catalyst, color, hardener, etc. After curing, the silica remains in the form of solid particles trapped within the epoxy matrix. Thus, although the reconstituted wafer 205 provides an outward appearance of homogeneity, at the molecular level the mold compound forming the reconstituted wafer 205 is a heterogeneous mixture of various materials.

The chemical and physical properties of the reconstituted wafer 205 are suitable for exposure to subsequent processing steps, for example resilience to high temperatures such as those encountered in soldering operations (e.g., about 200° C. to about 400° C.), and resistance to chemical attack, for example by the chemicals and chemical processes used in the photolithographic production of redistribution layers on the surface of the reconstituted wafer 205. In some instances, the formation of the reconstituted wafer 205 may employ the same manufacturing techniques and equipment used, for example in the production of embedded Wafer Level Ball Grid Array (eWLB) packages where the reconstituted wafer is used to provide a fan out area for the semiconductor die.

The reconstituted wafer 205 may be of any desired thickness or height subject to the limitations of the mold compound used to form the wafer. When all or a portion of the reconstituted wafer 205 is intended to provide a bar containing conductors useful for electrically connecting two or more semiconductor packages in a PoP package, the height of the reconstituted wafer 205 may be based upon the step height of the PoPb package (e.g. the difference in height between the PoPb fan out area and the PoPb mold cap) plus any necessary fabrication and/or finishing allowance. For example, the thickness of the reconstituted wafer 205 may be the step height of the PoPb package plus a 10% finishing allowance (110% overall step height); the step height of the PoPb package plus a 20% finishing allowance (120% overall step height); the step height of the PoPb package plus a 30% finishing allowance (130% overall step height); or the step height of the PoPb package plus a 50% finishing allowance (150% overall step height).

The cured reconstituted wafer 205 has two generally parallel opposed surfaces, a first surface 210 proximate the carrier and a second surface 215 that is generally opposed to the first surface 210. In some embodiments, the proximity of the dies 105 and the first surface 210 of the reconstituted wafer 205 to the carrier permits the formation of a generally planar first surface 210.

Figure 3A:
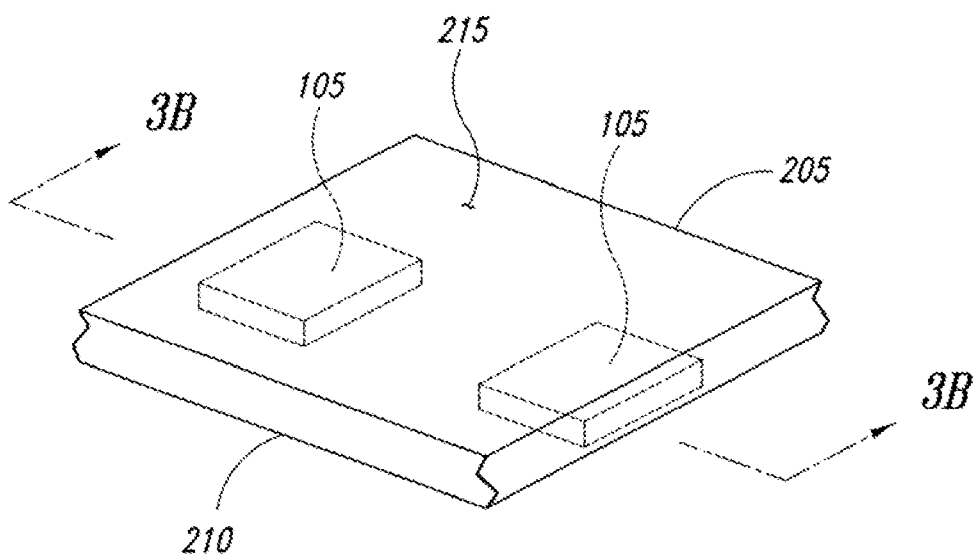
FIGS. 3A and 3B are perspective and sectional views, respectively, depicting an example reconstituted wafer formed about the dies.
Figure 3B:
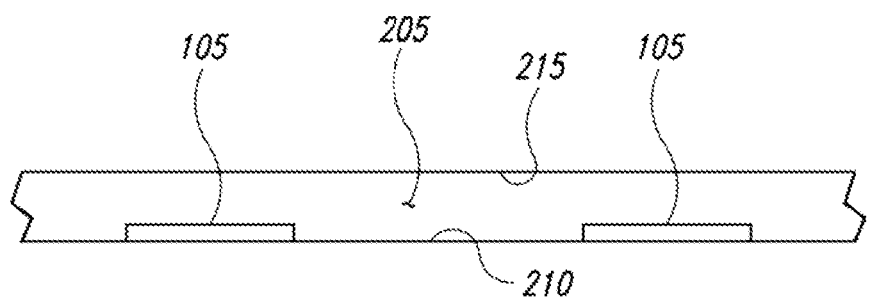

FIGS. 3A and 3B show the reconstituted wafer 205 after debonding from the carrier. Debonding the reconstituted wafer 205 from the carrier physically detaches the reconstituted wafer 205 from both the adhesive film or tape 110 and the rigid substrate 115. In at least some instances, heat may be applied to the reconstituted wafer 205 and/or the carrier to facilitate the debonding process. As depicted in FIG. 3B, debonding the reconstituted wafer 205 from the carrier exposes the first surface 210 of the reconstituted wafer 205, including the portion of the dies 105 formerly proximate the carrier surface.

FIGS. 4A and 4B show the forming of a plurality of voids 405 within the reconstituted wafer 205. The plurality of voids 405 extend from the first surface 210 into the reconstituted wafer 205. In some embodiments, at least a portion of the plurality of voids 405 may serve as alignment marks within the reconstituted wafer 205. The plurality of voids 405 may extend across all or a portion of the entire first surface 210 of the reconstituted wafer 205 in any number, spacing, pattern, etc.

The patterning of the plurality of voids 405 may be rendered in machine executable code, for example using computer aided design and computer aided manufacturing software. Execution of the machine executable code by a processor controlling the formation of the plurality of voids 405 can provide an extremely accurate pattern of voids 405 within the reconstituted wafer 205. In some instances the processor executing the code controlling the formation of the plurality of voids 405 within the reconstituted wafer 205 may use some or all of the dies 105 within the reconstituted wafer 205 as reference points for locating all or a portion of the plurality of voids 405.

In some instances, at least a portion of the plurality of voids 405 are disposed in a pattern 410 proximate the dies 105. Using the die 105 as a reference, the plurality of voids 405 may be formed in the reconstituted wafer 205 in locations complimentary to another semiconductor package, for example the plurality of voids 405 may be formed in a pattern 410 amenable to the subsequent coupling of a BGA PoPt package. In at least one embodiment, the plurality of voids 405 are disposed in patterns 410, 415 and 420 based upon the expected solder ball pitch and count of one or more PoPt packages.

The plurality of voids 405 may be formed using a chemical process, mechanical process (e.g. drilling), electromagnetic process (e.g. laser ablation) or any combination thereof. In a preferred embodiment, the plurality of voids 405 are formed via computer controlled laser ablation. The plurality of voids 405 may be formed in any desired number, pattern, density, or concentration including single voids, regular patterns of multiple voids, or irregular patterns of multiple voids.

In some instances, at least a portion of the plurality of voids 405 are disposed in a pattern 410 proximate the dies 105. Using die 105 as a reference, the plurality of voids 405 may be formed in the reconstituted wafer 205 in one or more locations. One or more voids 405 may also be disposed remote from the dies 105. These remote voids 405 may be disposed singly, or in regular or irregular patterns such as patterns 415 and 420, both containing a plurality of voids 405.

As mentioned above with regard to forming the reconstituted wafer 205, the cured reconstituted wafer is best considered a heterogeneous aggregate of cured epoxy, silica and various adjuncts. The use of laser ablation to form the plurality of voids 405 relies upon heating and vaporization of the material being ablated. When the laser forming the plurality of voids 405 is time controlled (i.e., a focused application of energy on a particular point for a fixed amount of time), the heterogeneous nature of the reconstituted wafer results in each of the plurality of voids 405 having to some degree varying depths and, to a lesser extent, diameters since the cured epoxy is typically vaporized faster than the silica particles embedded within the epoxy matrix. Each of the plurality of voids 405 may penetrate about 80% or less of the reconstituted wafer 205 thickness; about 85% or less of the reconstituted wafer 205 thickness; about 90% or less of the reconstituted wafer 205 thickness; about 95% or less of the reconstituted wafer 205 thickness; or about 100% or less of the reconstituted wafer 205 thickness. As mentioned previously, to account for the variability in void depth, the reconstituted wafer 205 can have a thickness greater than the desired final thickness to ensure the penetration of the laser to a depth in the reconstituted wafer 205 that equals or exceeds the minimum final thickness of the reconstituted wafer 205.

Figure 5A:
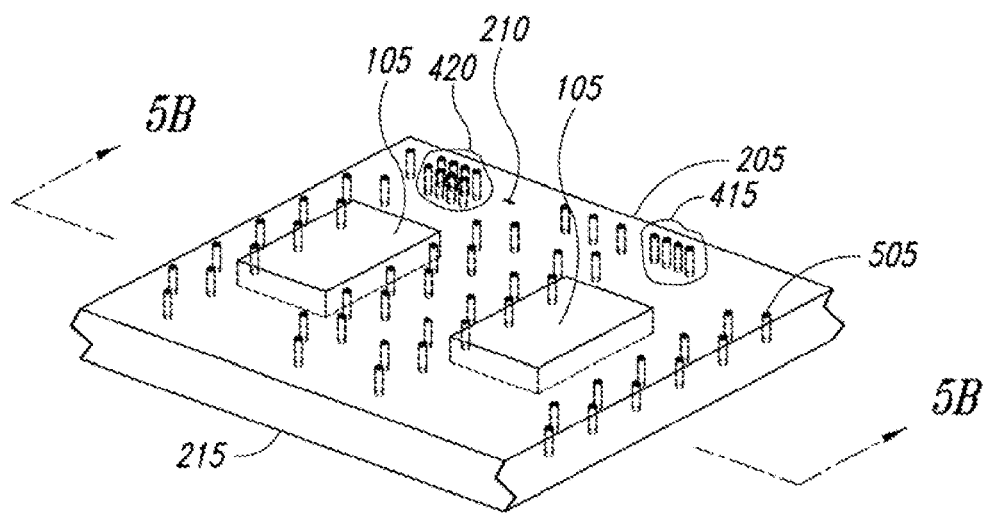
FIGS. 5A and 5B are perspective and sectional views, respectively, depicting an example reconstituted wafer including a plurality of voids filled with a conductive material.
Figure 5B:
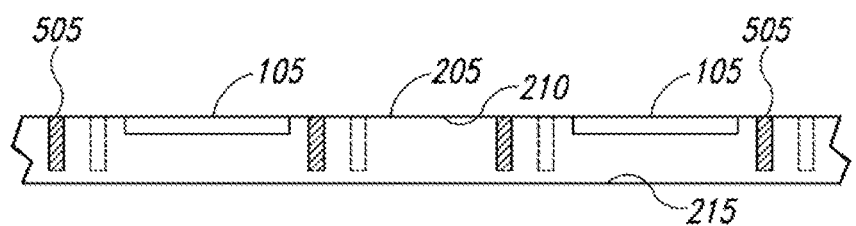

Although depicted as cylindrical in FIGS. 4A and 4B, each of the plurality of voids 405 may have a tapered profile due to the nature of the laser ablation process. As the laser penetrates the reconstituted wafer 205, material at the impact point of the laser experiences more rapid heating and vaporization than the surrounding material. As a consequence, the profile of the each of the resultant plurality of voids 405 will appear as a downward pointing triangular or "ice pick" shape when viewed in elevation. To provide a void 405 having more uniform cross section, and in recognition of the physical difficulty in forcing a conductive material into the extremely tight confines existent at the "point" at the end of the void (ref. FIGS. 5A and 5B), it is advantageous to remove the lower portion of the void to expose the cross-section of a larger diameter portion of the void (i.e. continuing the analogy, removing the "tip" to expose the larger diameter "shank" portion of the "ice pick"). Again, as mentioned previously, to account for the need to remove at least a portion of the void 405, the reconstituted wafer 205 may have a thickness slightly greater than the desired final thickness to provide a more or less uniform void diameter through the final reconstituted wafer 205.

In some instances the plurality of voids 405 can extend perpendicularly from, i.e. form a 90° angle measured with respect to, the first surface 210. In some instances the plurality of voids 405 can extend into the reconstituted wafer 205 at angles other than 90° measured with respect to the first surface 210. While each of the plurality of voids 405 may extend to differing depths within the reconstituted wafer, it is preferable that each of the plurality of voids 405 extend to the same depth within the reconstituted wafer 205. Although depicted as partially penetrating the reconstituted wafer 205 in FIG. 4B, in some embodiments, all or a portion of the voids 405 may extend from the first surface 210 to the second surface 215 of the reconstituted wafer 205—i.e., penetrating completely through the reconstituted wafer 205. The plurality of voids can have any selected diameter, preferably in the range of 0.05 mm to 0.7 mm. Usually the diameter will be a selected value that is a constant for each void in a particular wafer. For example, the plurality of voids 405 can have a diameter of about 0.05 mm, about 0.10 mm, about 0.15 mm, about 0.20 mm, about 0.30 mm, about 0.40 mm, or about 0.50 mm. While each of the plurality of voids 405 may have differing diameters in the same reconstituted wafer, in one embodiment each of the plurality of voids 405 have a similar diameter.

FIGS. 5A and 5B show the plurality voids 405 filled with a conductive material to form a plurality of conductive material filled voids 505. In some instances, the conductive material is a metallic paste containing one or more metallic components imparting electrically conductive properties to the paste, for example copper particles may be present in the conductive material 505 to provide the desired electrically conductive properties. In other instances, the conductive material is a non-metallic paste containing one or more non-metallic components imparting electrically conductive properties to the paste, for example electrically conductive graphene structures may be present in the paste to provide the desired electrically conductive properties.

The conductive material may be disposed within any or all of the plurality of voids 405 using any technique known in the art, including injection, spreading, vacuum deposition and the like. One or more physical properties of the conductive material may be adjusted or otherwise altered to improve one or more characteristics of the material or to improve the overall workability of the conductive material. For example, the viscosity of the conductive material may be adjusted to improve the flowability of the conductive material into the voids 405.

Additionally, since the conductive material serves as the electrical pathway between the PoPt package and the PoPb package and/or substrate, after filling each of the conductive material filled voids 505 should provide an electrically continuous path from the first surface 210 of the reconstituted wafer through the extent of the conductive material filled void 505. To minimize the likelihood of bubble or void formation within the conductive material filled void 505 one or more additives may also be introduced to the conductive material.

When all or a portion of the plurality of voids 405 extend completely through the reconstituted wafer 205, a backing member or tape (not shown in FIGS. 5A and 5B) may be attached or otherwise disposed proximate the second surface 215 of the reconstituted wafer 205 to prevent the conductive material from flowing out of or exiting the plurality of voids 405. After disposing the conductive material within the plurality of voids 405, the conductive material may be cured, for example through exposure to heat, electromagnetic energy or the like to form a solid conductor within each of the plurality of conductive material filled voids 505.

Figure 6A:
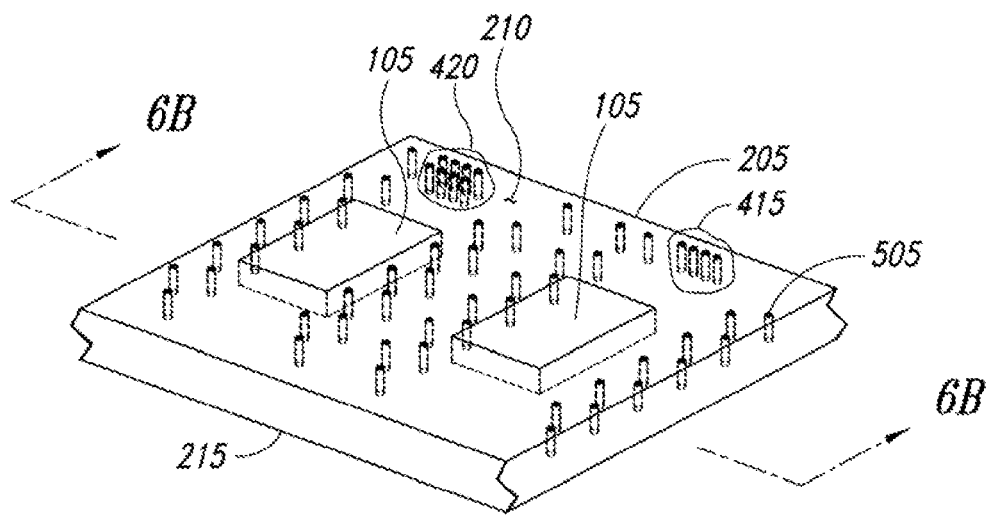
FIGS. 6A and 6B are perspective and sectional views, respectively, depicting an example reconstituted wafer where the plurality of conductive material filled voids have been exposed on a second surface of the reconstituted wafer.
Figure 6B:
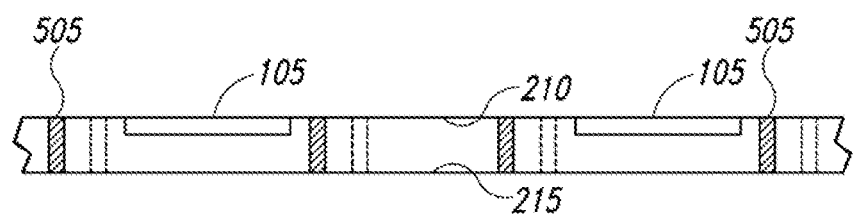

FIGS. 6A and 6B show the reconstituted wafer 205 with the conductive material filled voids 505 extending from the first surface 210 to the second surface 215 of the reconstituted wafer 205. When the plurality of conductive material filled voids 505 extend only partially through the reconstituted wafer 205, a portion of the second surface 215 of the reconstituted wafer 205 is removed to expose the conductive material filled voids 505. When the plurality of conductive material filled voids 505 extend completely through the reconstituted wafer 205, removal of significant portions of the second surface 215 may not be necessary, and instead only a planarization of the second surface 215 may be performed to smooth any overflow or overfill of the conductive material filled voids 505. FIG. 6B shows the conductive material extends continuously from the first surface 210 to the second surface 215 of the reconstituted wafer 205, thereby providing an electrical pathway from the first surface 210 to the second surface 215 of the reconstituted wafer 205. Note that while FIG. 6B depicts the conductive material filled voids 505 as having parallel sides, due to the manner in which the voids 405 are initially formed, the sides of the voids 405 may be irregular and/or may taper inwards as the void 405 extends away from the first surface 210.

When necessary, the removal of at least a portion of the second surface 215 of the reconstituted wafer 205 may be accomplished using any technique known in the industry. Such techniques can include, but are not limited to cutting, grinding, sanding and planarization processes. The amount of material removed from the second surface 215 of the reconstituted wafer 205 may depend in whole or in part on the physical characteristics such as the depth and/or geometry of the conductive material filled voids 505. The amount of material removed from the second surface 215 of the reconstituted wafer 205 may also depend in whole or in part upon the desired final thickness of the reconstituted wafer 205.

For example, when the conductive material filled void 505 tapers to a narrow point at its furthest penetration from the first surface 210 (i.e., the previously discussed "ice pick" scenario) it may be both physically advantageous (e.g. by providing a larger cross-sectional area to mate with a solder ball) and electrically advantageous (e.g. by providing a larger cross-sectional area having reduced resistance) to remove more than just the narrow point or "tip" of the tapered void to expose a larger cross-sectional area of the conductive material. When the second surface 215 of the reconstituted wafer 205 is removed, about 10% or less; about 20% or less; about 30% or less; or about 50% or less of the total reconstituted wafer 205 thickness may be lost in the removal process.

Figure 7A:
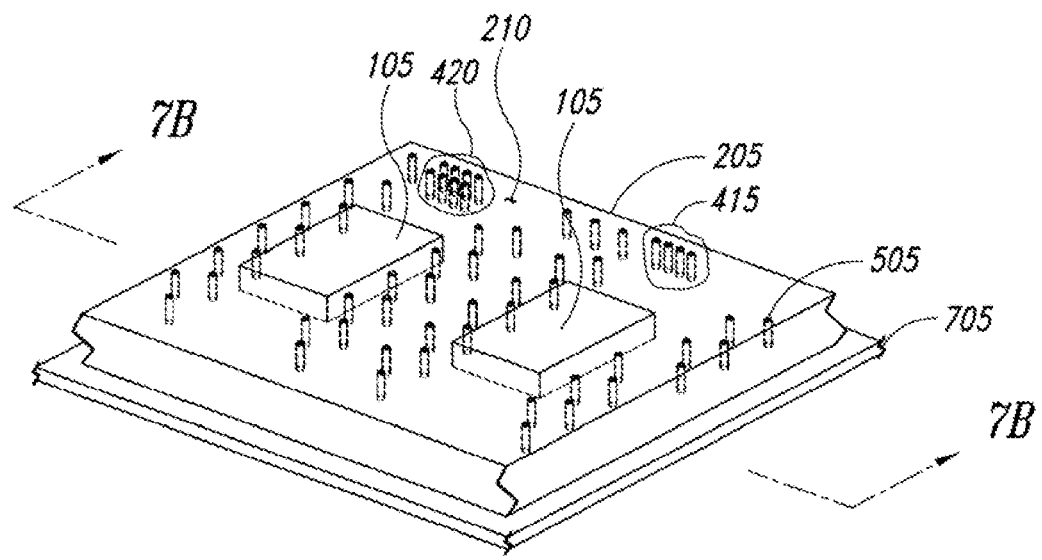
FIGS. 7A and 7B are perspective and sectional views, respectively, depicting an example reconstituted wafer including a plurality of voids filled with a conductive material attached to dicing tape.
Figure 7B:
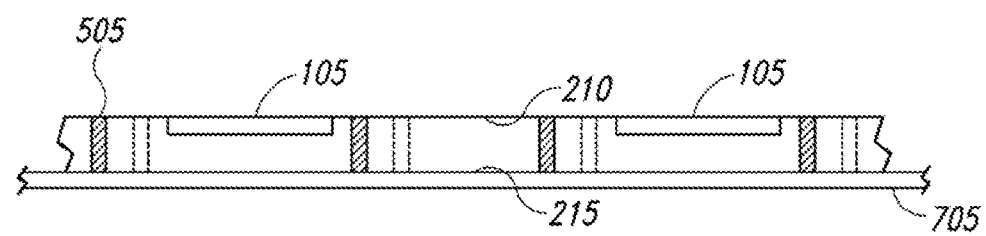

FIGS. 7A and 7B show the reconstituted wafer 205 having a plurality of conductive material filled voids 505 mounted on a carrier substrate 705. In at least some embodiments, the carrier substrate 705 can include a dicing tape made of PVC, polyolefin, or polyethylene backing material coated at least partially with an adhesive to hold the reconstituted wafer 205 in place. In some embodiments, an ultraviolet sensitive dicing tape may be used to provide a portion of the carrier substrate 705.

Figure 8A:
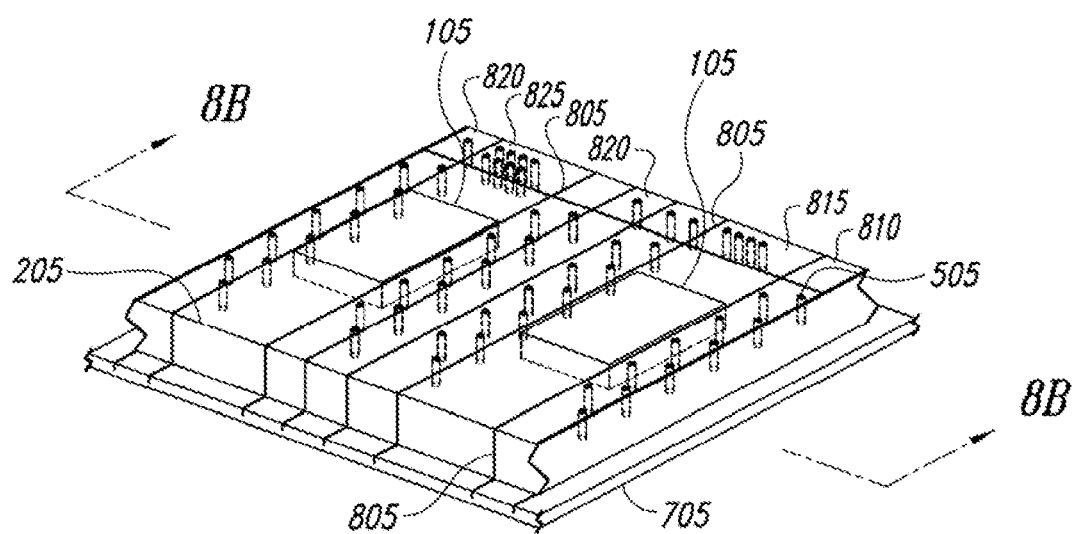
FIGS. 8A and 8B are perspective and sectional views, respectively, depicting an example reconstituted wafer including a plurality of voids filled with a conductive material attached to dicing tape containing saw cuts forming a plurality of bars, each bar having at least one conductive material filled void surrounded by reconstituted wafer.
Figure 8B:
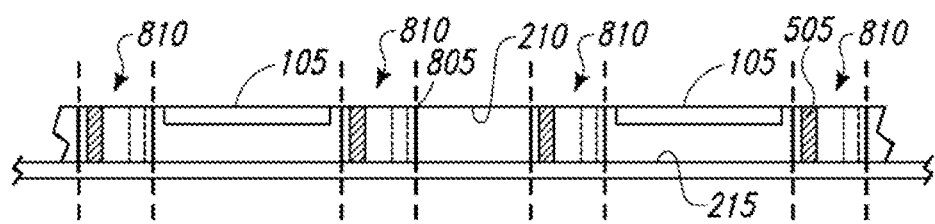

FIGS. 8A and 8B show the separation of the reconstituted wafer 205 to form a plurality of bars 810, 815, 820, 825, each containing at least one conductive material filled void 505 surrounded by a portion of the reconstituted wafer 205. The one or more conductive material filled voids 505 in each of the plurality of bars 810, 815, 820, 825 extend from the first surface 210 to the second surface 215 of the reconstituted wafer 205. The reconstituted wafer 205 may be separated or partitioned in any manner and the conductive material filled voids 505 may be separated singly or in groups as depicted in FIG. 8A. In some instances the separation or partitioning of the reconstituted wafer 205 may result in grouping at least one of conductive material filled voids 505 and one of the dies 105 within the same structure.

The separation or partitioning of the reconstituted wafer 205 may be accomplished using any technique known in the art, including mechanical separation (e.g. sawing), electromagnetic separation (e.g. laser ablation), or the like. As depicted in FIG. 8A, bars containing varying numbers of conductive material filled voids 505 may be produced using a single reconstituted wafer 205, for example bars 810 containing multiple conductive material filled voids 505 in a staggered pattern; bars 815 containing multiple conductive material filled voids 505 in a line; bars 820 containing a single conductive material filled void 505; and bars 825 containing multiple conductive material filled voids 505 in parallel lines.

As previously discussed, any number or pattern of conductive material filled voids 505 may be disposed in the reconstituted wafer 205. The inherent flexibility in patterning the conductive material filled voids 505 on the reconstituted wafer 205 (ref. FIGS. 4A, 4B, 5A and 5B) and the ability to form bars 810, 815, 820, 825 containing any number of conductive material filled voids 505 in the separation process improves timeliness and reduces the cost over traditional bar fabrication methods such printed circuit board via-based bars. Additionally, the ability to control the number and patterning of conductive material filled voids 505 within the bar as well as the overall bar thickness further enhances the usefulness of the described process in producing bars useful in a variety of different of PoP package configurations.

Figure 9A:
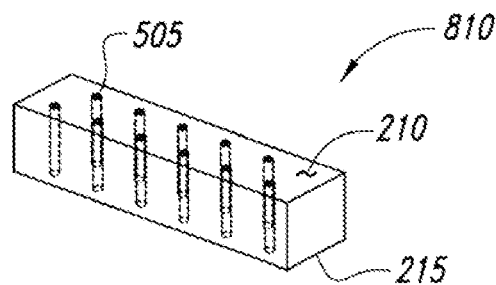
FIGS. 9A and 9B are perspective and plan views, respectively, depicting an example bar having a plurality of conductive material filled voids surrounded by reconstituted wafer.
Figure 9B:
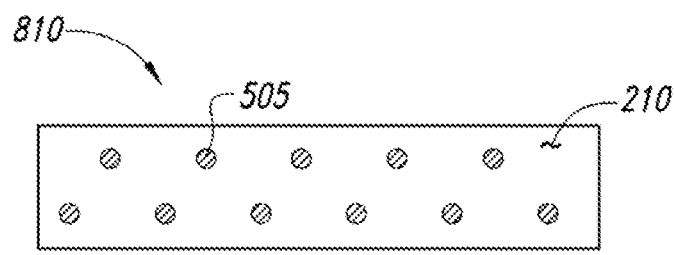
Figure 9C:
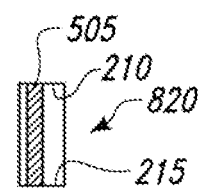
FIG. 9C is a sectional elevation depicting an example bar having a single conductive material filled void surrounded by reconstituted wafer.

FIGS. 9A, 9B and 9C show various bars resulting from the separation or partitioning of the reconstituted wafer 205. FIG. 9A provides a perspective view of the bar 810 containing multiple conductive material filled voids 505 in a staggered pattern. FIG. 9B is a plan view of the bar 810 containing multiple conductive material filled voids 505 in a staggered pattern. FIG. 9C is a sectional view of the bar 820 containing a single conductive material filled void 505.

Figure 10A:
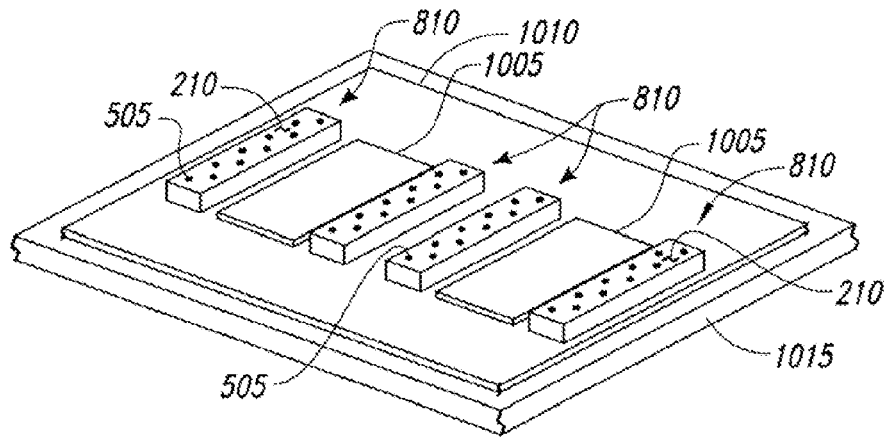
FIGS. 10A, 10B and 10C are perspective and sectional views, respectively, depicting example bars each having a plurality of conductive material filled voids disposed about semiconductor dies, the bars and dies attached to tape on a metal substrate.
Figure 10B:
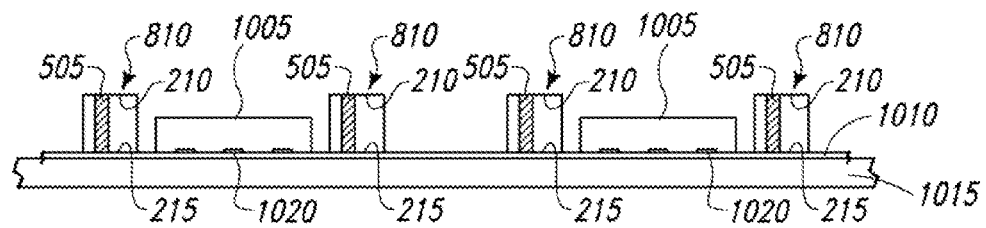
Figure 10C:
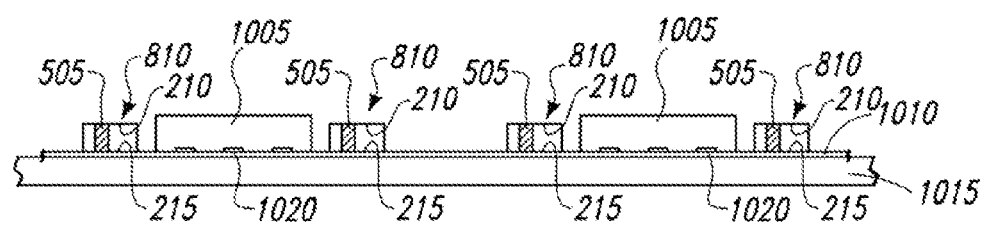

FIGS. 10A, 10B and 10C show bars 810 disposed about semiconductor dies 1005 attached to a metal or glass carrier 1015 using an adhesive film or tape 1010. In some instances, the semiconductor dies 1005 depicted in FIGS. 10A and 10B are PoPb semiconductor packages and the bars 810 are disposed within the future fan out area of the PoPb packages. The location or positioning of the bars 810 with respect to the semiconductor dies 1005 may, in some instances, correspond to the contact pad arrangement of a PoPt package when the semiconductor dies 1005 are used to provide the respective PoPb package. As depicted in FIG. 10B, in at least some embodiments, the bars 810 have a height or thickness that is equal to or greater than the height of the semiconductor dies 1005. As depicted in FIG. 10C, in some embodiments, the bars 810 have a height or thickness that is less than the height of the semiconductor dies 1005. Although bars 810 are depicted proximate the semiconductor dies 1005, any bar having any number or configuration of conductive material filled voids 505 may be similarly or differently arranged about all or a portion of the semiconductor dies 1005.

The arrangement, placement, number and orientation of the bars 810 about each of the semiconductor dies 1005 may be similar or different. For example, a first bar arrangement may be used to accommodate the future coupling of a first PoPt semiconductor package, while a second bar arrangement may be used to accommodate the future coupling of a second PoPt semiconductor package. The bars 810 may be disposed along any number of sides of the semiconductor die 1005, for example the bars 810 may be disposed along one, two, three, or four sides of the semiconductor die 1005. The bars 810 may also be disposed about two or more semiconductor dies 1005, for example one bar 810 may be disposed along a first side defined by two semiconductor dies 1005 while one bar 815 may be disposed along a second side defined by the two semiconductor dies 1005. Bars having dissimilar counts and/or dissimilar conductive material filled void 505 patterns may be disposed proximate a common semiconductor die 1005, for example a bar 810 may be disposed along a first side of a semiconductor die 1005 and a bar 820 may be disposed along a second side of the semiconductor die 1005.

Figure 11A:
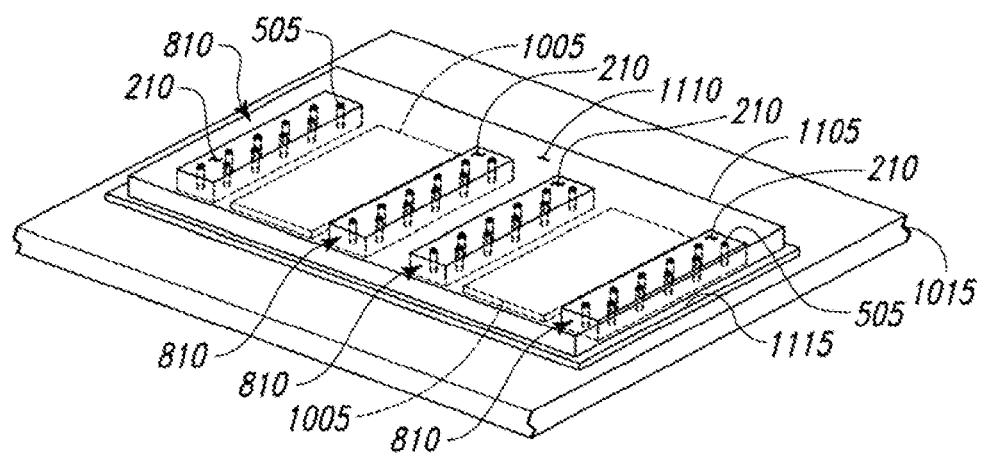
FIGS. 11A, 11B and 11C are perspective and sectional views, respectively, depicting example bars each having a plurality of conductive material filled voids disposed about semiconductor dies; the bars and semiconductor dies within a mold compound.
Figure 11B:
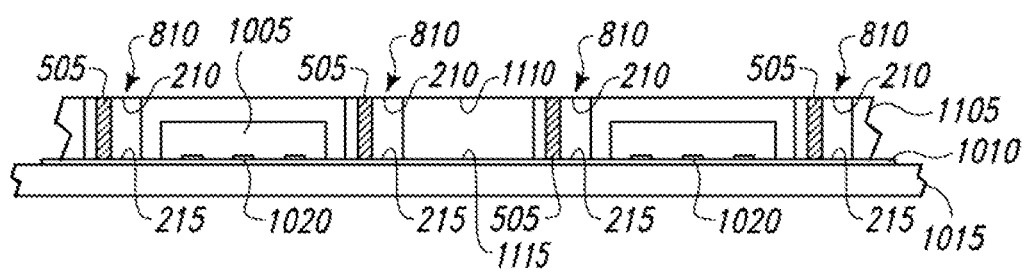
Figure 11C:
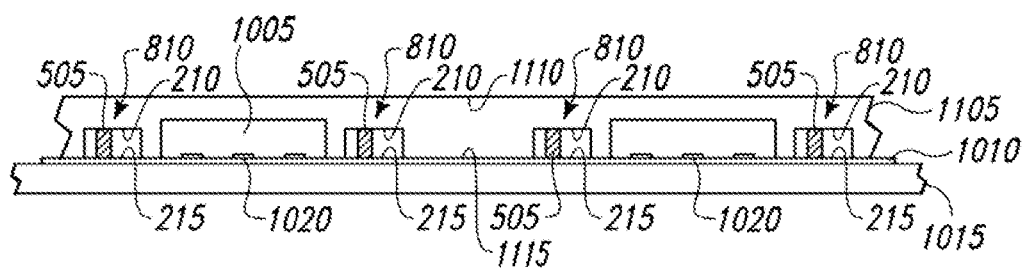

FIGS. 11A, 11B and 11C show the semiconductor dies 1005 and bars 810 surrounded by a cured mold compound 1105 attached to the carrier 1015 using an adhesive film or tape 1010. The cured mold compound 1105 is a thermosetting or thermoplastic material disposed about the semiconductor dies 1005 and the bars 810. In some instances, the mold compound 1105 and the reconstituted wafer 205 may use the same thermosetting or thermoplastic material. In other instances, the mold compound 1105 and the reconstituted wafer 205 use different thermosetting or thermoplastic material.

The mold compound 1105 can be applied or otherwise formed more or less level with the first surface 210 of the reconstituted wafer 205 forming the bar 810. As depicted in FIG. 11B, in some embodiments the mold compound 1105 covers and encapsulates the semiconductor dies 1005 while allowing the conductive material filled voids 505 on the first surface 210 to remain exposed. In at least one preferred embodiment depicted in FIG. 11C, the mold compound completely encapsulates both the bars 810 and the semiconductor dies 1005.

After curing, for example by exposure to elevated temperature or ultraviolet light, the mold compound 1105 forms a rigid structure having generally parallel upper and lower surfaces 1110 and 1115, respectively. The lower surface 1115 of the cured mold compound 1105 is proximate the carrier 1015 and thus forms a generally coplanar surface with the semiconductor die 1005 and the second surface 215 of the bars 810. Maintaining the contact pads 1020 and the exposed conductive material filled voids 505 on the second surface 215 of the reconstituted wafer 205 in a coplanar arrangement within the cured mold compound 1105 minimizes the need for surface finishing of the coplanar structures forming the lower surface 1115 of the cured mold compound 1105.

The upper surface 1110 of the cured mold compound 1105 may or may not be level with the first surface 210 of the reconstituted wafer 205 surrounding the conductive material filled voids 505. In some embodiments, the upper surface 1110 of the cured mold compound 1105 may be subjected to a surface finishing process including, but not limited to, grinding, cutting, or chemical mechanical planarization (CMP) to expose the conductive material filled voids 505 and to smooth or planarize the upper surface 1110 of the mold compound 1105.

The semiconductor package formed by the semiconductor die 1005 and the bars 810, once encased in a cured mold compound 1105, provides a eWLB PoPb package having a lower surface 1115 suitable for the application of one or more redistribution layers or for direct BGA mounting to an underlying substrate. The bars 810 are disposed in and form a portion of the fan out area of the PoPb package and provide a surface suitable for the application of one or more redistribution layers or for direct mounting of a BGA PoPt package or a embedded wafer level BGA PoPt package. Since the diameter and spacing of the conductive material filled voids 505 is closely controlled, conventional BGA packages and even fine pitch BGA packages may be used to provide the PoPt package.

Figure 12A:
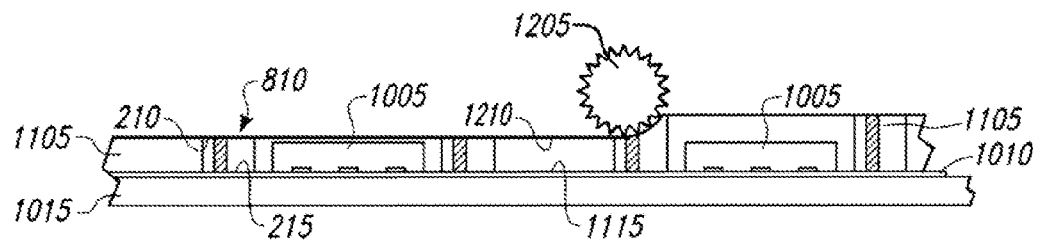
FIGS. 12A, 12B, 12C and 12D are sectional views depicting an example finishing of the mold compound surface to expose the bars having a plurality of conductive material filled voids.
Figure 12B:
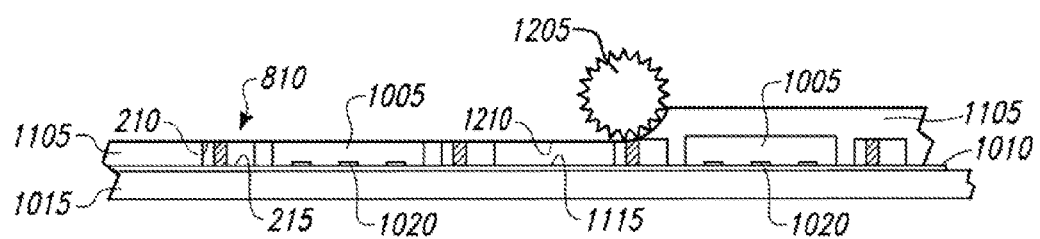
Figure 12C:
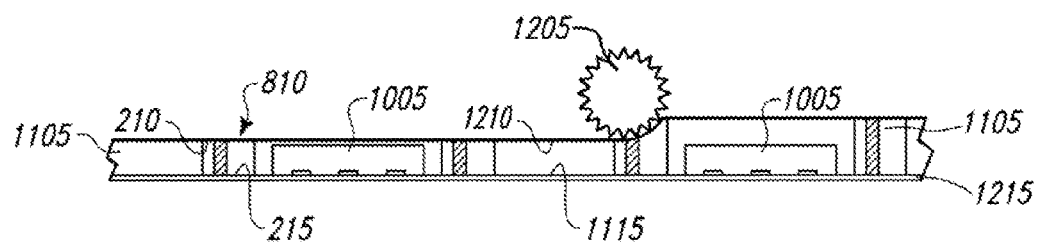
Figure 12D:
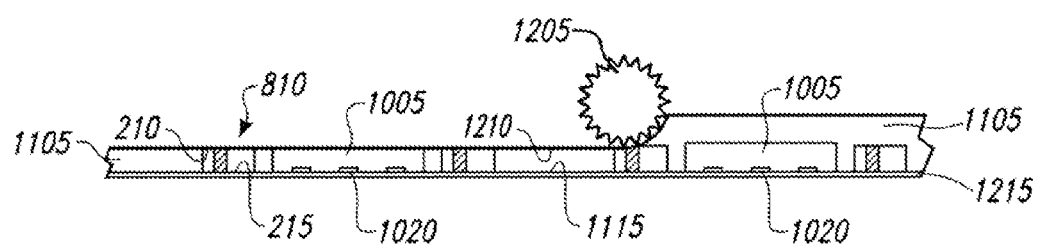

FIGS. 12A, 12B, 12C and 12D show the surface finishing of the cured mold compound 1105 exposing the plurality of conductive material filled voids 505 within each of the bars 805. FIGS. 12A and 12B depict one example embodiment where the cured mold compound 1105 is finished while remaining attached to the carrier 1015 with an adhesive film or tape 1010. FIGS. 12C and 12D depict another example embodiment where the carrier 1015 and the adhesive film or tape 1010 have been removed and a surface protection tape 1215 applied to the lower surface 1115 of the cured mold compound 1105 prior to surface finishing 1205 of the cured mold compound. The quantity of cured mold compound 1105 removed may depend upon a variety of factors including, but not limited to, the height or thickness of the bars 810, the height or thickness of the semiconductor dies 1005, the desired height or thickness of the PoPb package containing the semiconductor dies 1005, and/or the desired height of the final PoP package. The surface finishing process 1205 is capable of providing a smooth, finished surface 1210 suitable for the subsequent addition of one or more redistribution layers prior to subsequent processing of the resultant semiconductor package, for example as the PoPb package in a finished PoP package.

In at least one alternative depicted in FIG. 12A, the surface finishing process 1205 can provide a finished surface 1210 where the plurality of conductive material filled voids 505 are exposed while the semiconductor dies 1005 remain embedded within or covered by the mold compound 1105. The presence of the mold compound 1105 about the semiconductor dies 1005, in conjunction with the relatively rigid carrier 1015 provides sufficient strength and rigidity to avoid damage to the bars 810 and the semiconductor dies 1005 during the surface finishing process 1205.

However, in a preferred embodiment depicted in FIG. 12B, the overall height of the semiconductor package can be minimized by removing a portion of both the cured mold compound 1105 and a portion of the rear surface of the semiconductor die 1005. At the conclusion of this surface finishing process 1205, a wafer having a finished surface 1210 incorporating exposed, coplanar, bars 810, conductive filled voids 505 and semiconductor dies 1005 is provided. Despite the thinness of the resultant semiconductor package, the presence of the mold compound 1105 and the carrier 1015 provide sufficient strength and rigidity to avoid damage to either the bars 810 or the semiconductor dies 1005 during the surface finishing process 1205. However, additional layers may be added to the finished surface 1210, including the exposed semiconductor dies 1005, to protect the exposed bars 810 and semiconductor dies 1005 from contamination and/or damage.

The finishing process 1205 includes any process known in the art that is suitable for removal of materials such as cured mold compound, silicon, etc. Example finishing processes 1205 can include, but are not limited to sanding, grinding, chemical/mechanical planarization (CMP), combinations thereof, and the like. After removal of the cured mold compound 1105 and, in some instances, a portion of the semiconductor die 1005, the conductive material filled voids 505 are exposed on the finished surface 1210. The finished surface 1210 can thus include a plurality of coplanar structures including the first surface 210 of the bar 810, the surface of the cured mold compound 1105, and at times, the exposed semiconductor die 1005.

Figure 13A:
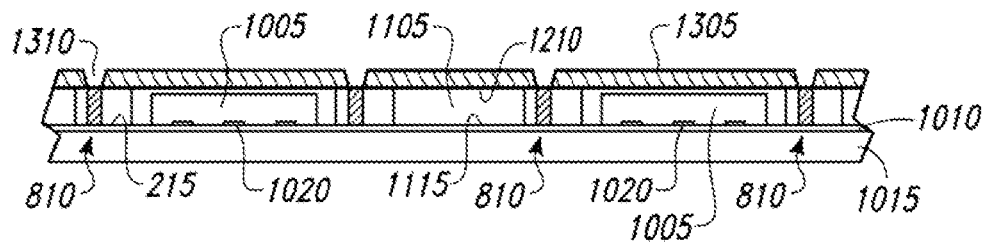
FIGS. 13A, 13B, 13C and 13D are sectional views depicting an example patterned deposition of an insulator on the finished surface of the bars.
Figure 13B:
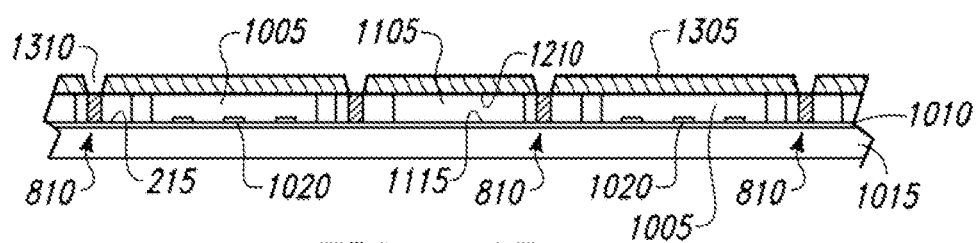

FIGS. 13A, 13B, 13C and 13D show the patterned deposition of a first dielectric layer 1305 across the finished surface 1210. FIGS. 13A and 13B depict one example embodiment where the first dielectric layer 1305 is patterned on the finished surface 1210 while the cured mold compound 1105 remains attached to the carrier 1015 with an adhesive film or tape 1010. Patterned gaps, voids, or similar openings 1310 exist within the first dielectric layer 1305 proximate each of the plurality conductive material filled voids 505. The first dielectric layer 1305 can include any material suitable for sealing and/or protecting the first surface 210 of the reconstituted wafer 205 surrounding the conductive material filled voids 505, and the exposed rear surface of the semiconductor dies 1005. Example dielectric materials include one or more insulating materials known in the art, including silicon oxides, silicon nitrides, and silicon carbides, and the like.

In some embodiments such as those depicted in FIG. 13A, after the surface finishing process 1205 the semiconductor die 1005 can remain unexposed, encapsulated within the cured mold compound 1105. When cured mold compound 1105 surrounds the semiconductor die 1005, the cured mold compound 1105 seals the die from the ambient environment about the die, protecting the die from contamination and physical damage. Additionally, deposition of the first dielectric layer 1305 on the finished surface 1210 and the upper surface 210 of the reconstituted wafer 205 seals the relatively permeable reconstituted wafer 205 surrounding the conductive material filled voids 505.

As depicted in FIG. 13B, when a thin semiconductor package is desired, additional cured mold compound 1105 and a portion of the semiconductor dies 1005 can be removed during the surface finishing process 1205. When exposed by the surface finishing process 1205, the risk of contamination and/or damage to the semiconductor die 1005 is increased. Deposition of the first dielectric layer 1305 on the finished surface 1210, the first surface 210 of the reconstituted wafer 205, and the exposed semiconductor die 1005 seals the relatively permeable reconstituted wafer 205 surrounding the conductive material filled voids 505 and provides protection for the exposed rear portion of the semiconductor die 1005.

Figure 13C:
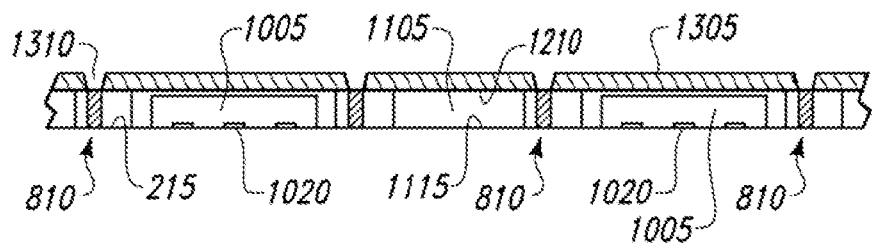
Figure 13D:
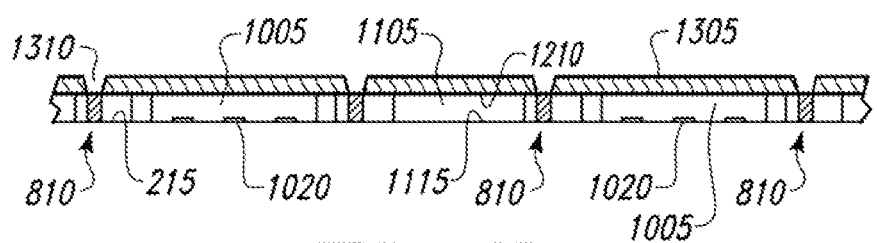

FIGS. 13C and 13D depict another example embodiment where the surface protection tape 1015 has been removed from the cured mold compound 1105 prior to the patterned deposition of the first dielectric layer 1305. After removing the protective tape 1015 from the cured mold compound 1105, one or more redistribution layers can be formed on the finished upper surface 1210 of the cured mold compound 1105. Alternatively, since both the upper and lower surfaces of the cured mold compound 1105 are exposed after removal of the surface protection tape 1015, one or more redistribution layers may be applied first to the lower surface 1115 of the cured mold compound 1105 before being applied to the upper surface 1210 of the cured mold compound 1105. In some embodiments, the individual PoPb packages incorporating the semiconductor die 1005 and the associated bars 810 within the die fan out area can be singulated after formation of the upper and/or lower redistribution layers on the cured mold compound 1105.

Figure 14A:
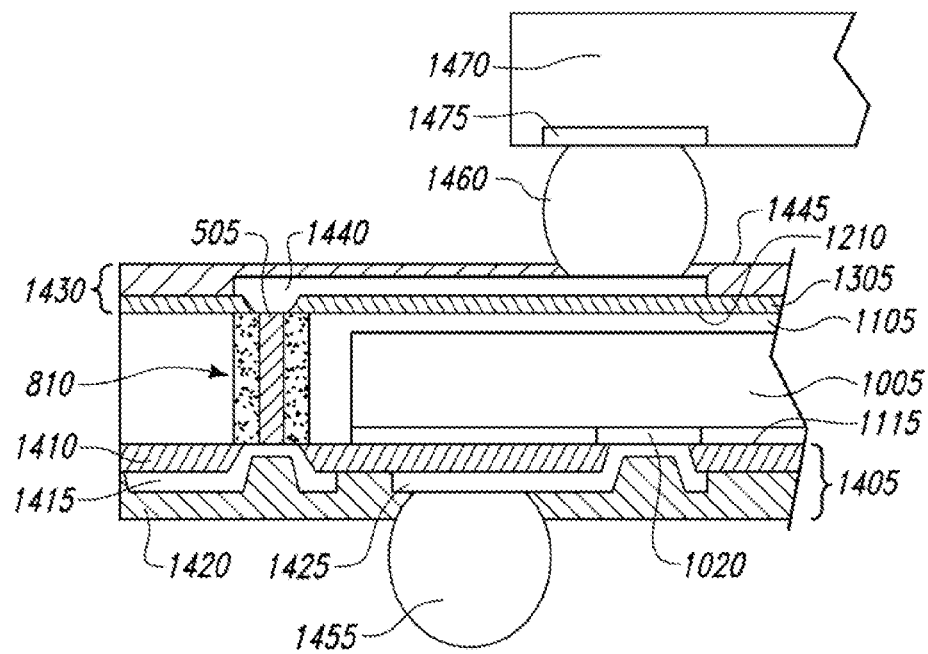
FIGS. 14A and 14B depict cross sectional views of example stacked package on package semiconductor devices.
Figure 14B:
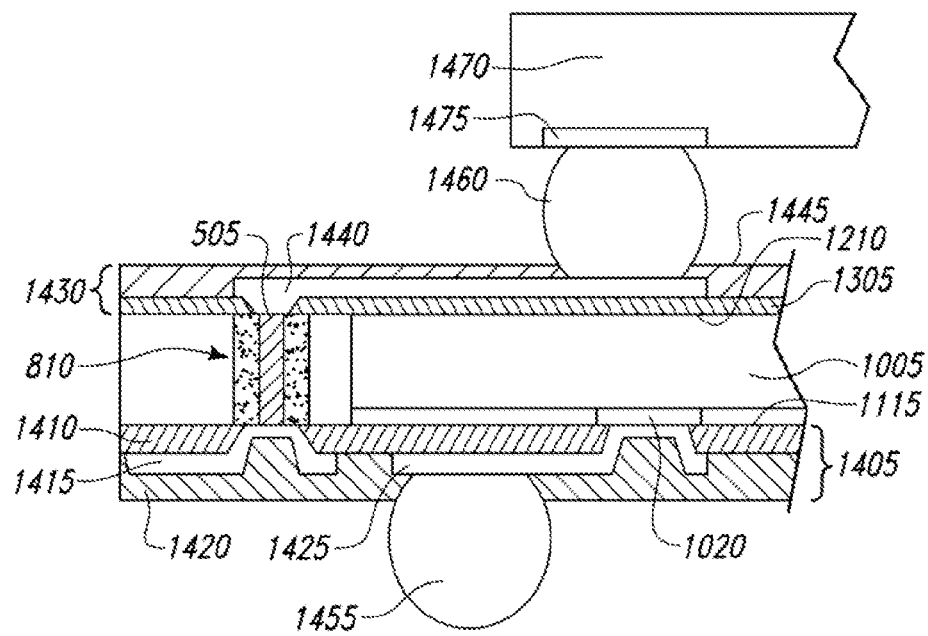

FIGS. 14A and 14B show sectional views of a PoP package including a PoPt package 1470 and a PoPb package including the semiconductor die 1005 and a bar 810 with a conductive material filled void 505 surrounded by reconstituted wafer 205. A lower redistribution layer 1405 is depicted proximate the lower surface 1115 of the cured mold compound 1105. An upper redistribution layer 1435 is depicted proximate the finished upper surface 1210 of the cured mold compound 1105.

While the lower redistribution layer 1405 in FIGS. 14A and 14B is depicted as a metal layer 1415 disposed partially between two dielectric layers 1410 and 1420, additional metal and/or dielectric layers may be added using techniques known in the art. The various dielectric layers 1410, 1420, 1305 and 1445 may be formed using one or more insulators such as silicon nitride, silicon oxide, silicon carbide, or similar deposited and/or patterned onto the appropriate surface using one or more deposition and/or patterning techniques known in the art.

The first dielectric layer 1305 is patterned onto the finished upper surface 1210 of the cured mold compound 1105 followed by the metal layer 1440 which is deposited and/or patterned onto the finished upper surface 1210 and the first dielectric layer 1305 using one or more deposition and/or patterning techniques known in the art. The metal layer 1440 electrically couples the conductive material filled void 505 with one or more exposed contact pads 1475 on the PoPt package 1470, for example using one or more solder balls 1460. A second dielectric layer 1445 is patterned onto the finished upper surface 1210, the first dielectric layer 1305, and the metal layer 1440 using one or more deposition and/or patterning techniques known in the art. When completed, the upper redistribution layer 1405 provides a plurality of electrical pathways coupling: the PoPt package 1470 to the underlying substrate via the bar 810; and, the PoPt package 1470 to the PoPb package via the plurality of conductive material filled voids 505 in the bar 810.

A third dielectric layer 1410 is deposited and/or patterned onto the lower surface 1115 of the cured mold compound 1105 followed by the metal layer 1415 which is deposited and/or patterned onto the lower surface 1115 and the third dielectric layer 1410 using one or more deposition and/or patterning techniques known in the art. The metal layer 1415 electrically couples the contact pads 1020 on the surface of the semiconductor die 1005 to one or more contact pads 1425 on the exterior surface of the PoPb package. The metal layer 1415 may also couple a portion of the plurality of conductive material filled voids 505 with one or more contact pads 1020 and/or with the exposed contact pads 1425 on the exterior surface of the PoPb package. The fourth dielectric layer 1420 is deposited and/or patterned onto the lower surface 1115, the metal layer 1415 and the third dielectric layer 1410 using one or more deposition and/or patterning techniques known in the art. When completed, the lower redistribution layer 1405 provides a plurality of electrical pathways coupling: the semiconductor wafer 1005 to the underlying substrate; the PoPt package 1470 to the underlying substrate via the bar 810; and, the PoPt package 1470 to the PoPb package via the plurality of conductive material filled voids 505 within the bar 810.

The PoPb package is coupled to the underlying substrate (not shown) using a plurality of solder balls 1455. Similarly, the PoPt package 1470 is coupled to the upper redistribution layer 1430 using a plurality of solder balls 1460.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A ball grid array method, comprising:
   forming a reconstituted wafer about a plurality of dies;
   forming a plurality of voids in the reconstituted wafer, the plurality of voids extending perpendicularly from a first reconstituted wafer surface into the reconstituted wafer;
   filling the plurality of voids with a conductive material;
   forming a plurality of bars that each include a portion of the plurality of voids filled with conductive material by separating the reconstituted wafer;
   forming a semiconductor package by covering portions of at least one of the bars and at least one semiconductor die with a protective material;
   forming a first redistribution layer on a first surface of the semiconductor package, the first surface comprising an exposed portion of the first reconstituted wafer surface; and
   forming a second redistribution layer on a second surface of the semiconductor package, the second surface opposite the first surface; the second surface comprising an exposed portion of a second surface of the reconstituted wafer, the second reconstituted wafer surface opposite the first reconstituted wafer surface.

2. The method of claim 1
   wherein forming the reconstituted wafer comprises forming the reconstituted wafer about a plurality of inert reference dies; and
   wherein the protective material is a molding compound.

3. The method of claim 1 wherein the plurality of dies comprises a plurality of semiconductor dies.

4. The method of claim 1
   wherein forming the first redistribution layer on the first surface of the semiconductor package comprises:
   patterning a first dielectric layer on the first surface of the semiconductor package;
   patterning a metal layer on the first dielectric layer; and
   patterning a second dielectric layer on the metal layer; and
   wherein forming the second redistribution layer on the second surface of the semiconductor package comprises:
   patterning a third dielectric layer on the second surface of the semiconductor package;
   patterning a metal layer on the third dielectric layer; and
   patterning a fourth dielectric layer on the metal layer.

5. The method of claim 1 wherein the plurality of conductive material filled voids extend through from the first reconstituted wafer surface to the opposed second reconstituted wafer surface.

6. The method of claim 1, further comprising removing at least a portion of the second reconstituted wafer surface to expose the plurality of conductive material filled voids.

7. The method of claim 1 wherein forming a plurality of voids in the first reconstituted wafer surface comprises:
removing a portion of the reconstituted wafer using electromagnetic energy.

8. The method of claim 1 wherein forming a plurality of voids in the first reconstituted wafer surface comprises:
removing a portion of the reconstituted wafer using mechanical energy.

9. The method of claim 1 wherein the conductive material comprises a copper paste.

10. The method of claim 1, wherein forming the reconstituted wafer about the plurality of dies comprises covering the plurality of dies with a mold compound.

11. The method of claim 1, wherein separating the reconstituted wafer comprises separating the plurality of dies into individual packages and separating portions of the reconstituted wafer to form the plurality of bars.

12. A ball grid array method, comprising:
forming a reconstituted wafer about a plurality of dies;
forming a plurality of voids in the reconstituted wafer, the plurality of voids extending perpendicularly from a first reconstituted wafer surface into the reconstituted wafer;
filling the plurality of voids with a conductive material;
forming a plurality of bars by separating the reconstituted wafer, each of the plurality of bars including at least one void filled with conductive material;
forming a semiconductor package by covering at least side surfaces of one of the bars and at least side surfaces of a semiconductor die;
forming a first redistribution layer on a first package surface of the semiconductor package, the first package surface comprising an exposed portion of the first reconstituted wafer surface; and
forming a second redistribution layer on a second package surface of the semiconductor package, the second package surface opposite the first package surface, the second package surface comprising an exposed portion of a second surface of the reconstituted wafer, the second reconstituted wafer surface opposite the first reconstituted wafer surface.

13. The method of claim 12 wherein the plurality of dies comprises a plurality of inert reference dies; and
wherein forming the semiconductor package comprises:
disposing at least one bar proximate the at least one semiconductor die;
disposing mold compound about the at least one bar and the at least one semiconductor die to provide the semiconductor package.

14. The method of claim 12 wherein the plurality of dies comprises a plurality of semiconductor dies; and
wherein forming the semiconductor package comprises:
disposing at least one bar proximate the at least one semiconductor die;
disposing mold compound about the side surfaces and a rear surface of the bar and side surfaces of the semiconductor die.

15. The method of claim 12 wherein the plurality of voids extending perpendicularly from the first reconstituted wafer surface into the reconstituted wafer extend through the reconstituted wafer to the second reconstituted wafer surface.

16. The method of claim 12, further comprising:
removing at least a portion of the second reconstituted wafer surface to expose the plurality of voids extending perpendicularly into the reconstituted wafer.

17. The method of claim 12, wherein forming the reconstituted wafer about the plurality of dies comprises covering the plurality of dies with a mold compound.

18. The method of claim 12, wherein separating the reconstituted wafer comprises separating the plurality of dies into individual packages and separating portions of the reconstituted wafer to form the plurality of bars.

* * * * *